United States Patent
Guenot et al.

(10) Patent No.: US 12,411,182 B2
(45) Date of Patent: Sep. 9, 2025

(54) DEVICE FOR MEASURING THE VOLTAGE OF ONE OR MORE ELECTROCHEMICAL CELLS

(71) Applicant: ALSTOM Hydrogène SAS, Aix-en-Provence (FR)

(72) Inventors: Benoit Guenot, Aix-en-Provence (FR); André Rakotondrainibe, Aix-en-Provence (FR)

(73) Assignee: ALSTOM HYDROGÈNE SAS, Aix-en-Provence (FR)

( * ) Notice: Subject to any disclaimer, the term of this patent is extended or adjusted under 35 U.S.C. 154(b) by 351 days.

(21) Appl. No.: 17/750,854

(22) Filed: May 23, 2022

(65) Prior Publication Data

US 2022/0381837 A1 Dec. 1, 2022

(30) Foreign Application Priority Data

May 26, 2021 (FR) ..................................... 21 05460

(51) Int. Cl.
*G01R 31/385* (2019.01)
*G01R 19/00* (2006.01)
*G01R 31/378* (2019.01)
*H01M 8/0202* (2016.01)

(52) U.S. Cl.
CPC ....... *G01R 31/385* (2019.01); *G01R 19/0084* (2013.01); *G01R 31/378* (2019.01); *H01M 8/0202* (2013.01)

(58) Field of Classification Search
CPC .............. G01R 31/385; G01R 31/378; G01R 19/0084; H01M 8/0202

USPC ........ 324/500, 510–515, 323–368, 600, 637, 324/200, 263, 522, 713, 76.11, 324/76.69–76.77
See application file for complete search history.

(56) References Cited

U.S. PATENT DOCUMENTS

| | | | | |
|---|---|---|---|---|
| 9,786,935 B2* | 10/2017 | Furusawa | ......... | H01M 8/04768 |
| 11,553,068 B2* | 1/2023 | Lee | ........ | H04M 1/026 |
| 2002/0177019 A1* | 11/2002 | Aoto | .......... | H01M 8/0247 |
| | | | | 429/432 |
| 2004/0095127 A1* | 5/2004 | Mohri | .......... | G01R 31/382 |
| | | | | 324/117 R |

(Continued)

FOREIGN PATENT DOCUMENTS

EP    2 017 630    1/2009

OTHER PUBLICATIONS

FR Search Report for FR2105460 dated Feb. 14, 2022, 2 pages.

*Primary Examiner* — Huy Q Phan
*Assistant Examiner* — Trung Q Nguyen
(74) *Attorney, Agent, or Firm* — NIXON & VANDERHYE, PC

(57) ABSTRACT

The voltage-measuring device is adapted to perform voltage measurements on a laminate assembly formed of separators and of at least one membrane electrode assembly stacked to form one or more electrochemical cells. It includes two measuring plates on which are distributed a plurality of electrical contacts spaced apart from each other and electrically insulated from each other, the measuring plates being configured to be arranged on either side of the laminate assembly, the measuring face of each measuring plate being applied against a respective separator in such a way that the electrical contacts located on this measuring face are in contact with the separator.

18 Claims, 4 Drawing Sheets

(56) References Cited

U.S. PATENT DOCUMENTS

| | | | |
|---|---|---|---|
| 2006/0147787 A1* | 7/2006 | Yamauchi | H01M 8/242 |
| | | | 429/480 |
| 2008/0280178 A1* | 11/2008 | Spink | H01M 8/248 |
| | | | 429/514 |
| 2009/0068506 A1 | 3/2009 | Tomura | |
| 2012/0139553 A1* | 6/2012 | Nortman | H02J 9/002 |
| | | | 324/126 |
| 2015/0236360 A1* | 8/2015 | Roemer | H01M 8/242 |
| | | | 429/482 |
| 2016/0116541 A1* | 4/2016 | Usami | G01R 31/3865 |
| | | | 429/535 |

* cited by examiner

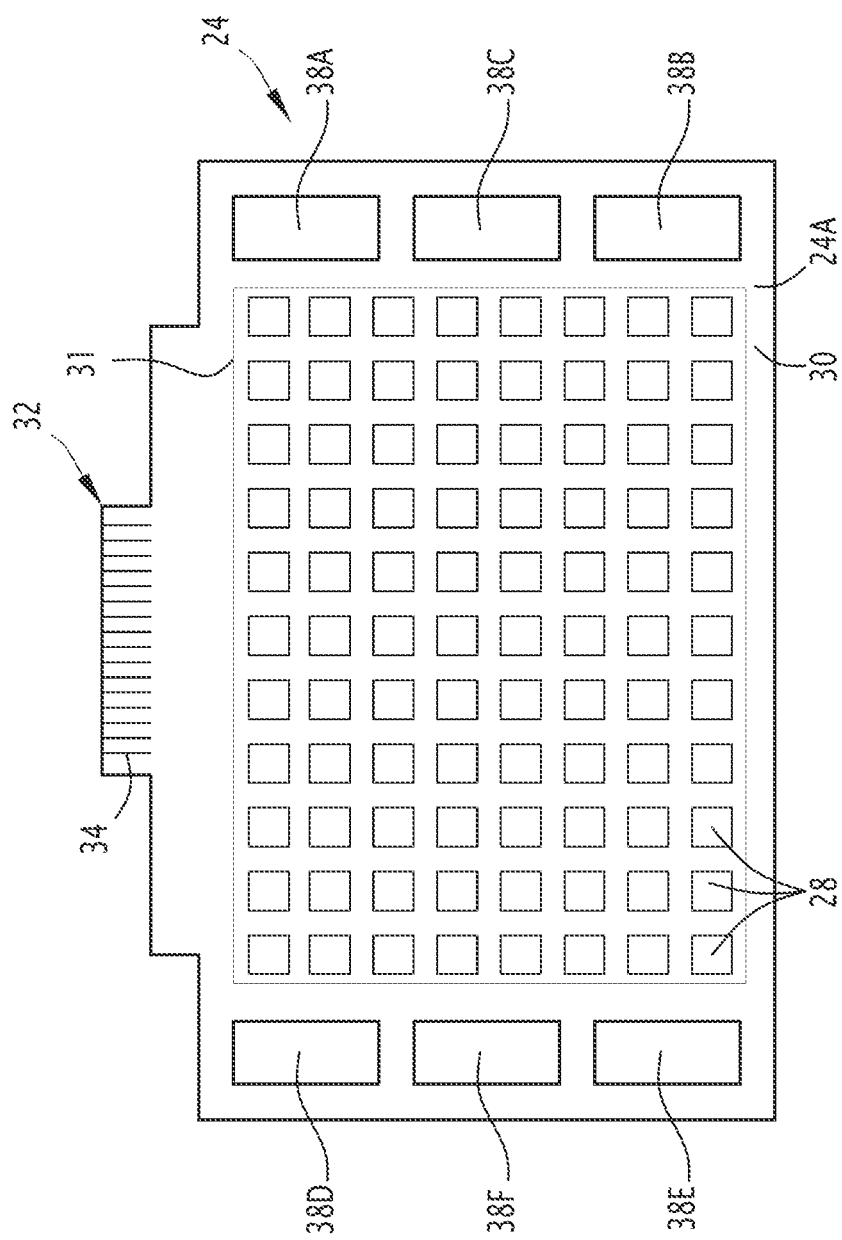

DEVICE FOR MEASURING THE VOLTAGE OF ONE OR MORE ELECTROCHEMICAL CELLS

CROSS-REFERENCE RELATED TO PRIORITY APPLICATIONS

This application claims priority to FR 21 05460 filed May 26, 2021, the entire contents of which are hereby incorporated by reference.

BACKGROUND OF THE INVENTION

Field of the Invention

The present invention relates to the field of electrochemical reactors comprising a stack formed of separators and membrane electrode assemblies stacked along a stacking direction and defining one or more electrochemical cells.

Description of the Related Art

Such an electrochemical reactor is for example a fuel cell for the production of electricity by electrochemical reaction between an oxidant and a fuel, or an electrolyser for the separation of chemical elements from a fluid using electricity, for example for the production of dihydrogen and dioxygen from water.

In such an electrochemical reactor, each membrane electrode assembly is in the form of a laminate comprising an ion exchange membrane inserted between two electrodes.

Each separator is electrically conductive and is in the form of a plate, one or each of the two faces of the separator being configured to be applied against a face of a membrane electrode assembly defining with that face of the membrane electrode assembly a fluid chamber for the flow of a fluid along said face of the membrane electrode assembly.

In the stack, each electrochemical cell is defined by a membrane electrode assembly between two separators, each of the separators defining a fluid chamber with the face of the membrane electrode assembly against which it is applied, the electrochemical reaction being carried out by ion exchange between fluids flowing through the fluid chambers, through the membrane electrode assembly.

The electrochemical cells are electrically connected in series. The separators ensure the conduction of electric current between the electrochemical cells and the distribution of fluids in the electrochemical cells.

The stack is generally maintained under mechanical compression such as a filter press type along the stacking direction in order to obtain a good fluid seal between the separators and the membrane electrode assemblies, to ensure good electrical contact between the different elements (separators and membrane electrode assemblies) and to ensure an efficient electrochemical reaction.

It is desirable to improve and make more reliable the electrochemical performance and durability of electrochemical reactors formed by stacking separators and membrane electrode assemblies.

The electrochemical performance of such an electrochemical reactor depends on several factors, in particular the nature and the physical/chemical, thermal and mechanical characteristics of the materials constituting each membrane electrode assembly, the design and geometry of the separators which allow both the distribution of fluids and the conduction of electric current, the state of mechanical compression of the stack, and the operating conditions, in particular the temperature, pressure and flow rate of each of the fluids circulating in the electrochemical cells.

The electrochemical performance of an electrochemical cell is defined in particular by its polarisation curve relating the voltage response to the current (i.e. relating the electrical voltage between the two separators of the electrochemical cell to the electrical current flowing through the electrochemical cell), and therefore the associated electrical power as a function of the operating conditions.

The measurement of the voltage of one or more electrochemical cells in a stack is carried out, for example, by means of electrical contacts which are brought into contact with the separators in contact zones provided for this purpose on the separators, the contact zone of each separator being situated at a localised point on the separator which is accessible after the stack has been made, for example on a peripheral edge of the separator.

However, the measurement of the voltage of an electrochemical cell carried out from a contact zone located on each of the two separators of that electrochemical cell may depend on the location of the contact zones on the separators, i.e. at the periphery of the separators, i.e. on the faces of the separators perpendicular to the plane of the membrane electrode assembly, or on the faces of the separators parallel to the plane of the membrane electrode assembly. A different location of the contact zones on the separators may give a different result.

This is particularly the case for separators made by thermocompression of a composite material consisting of graphite and/or carbon powder embedded in a matrix containing a polymeric binder and/or a resin. Such separators may indeed exhibit anisotropic electrical conductivity.

SUMMARY OF THE INVENTION

One of the purposes of the invention is to provide a voltage measurement device for reliably measuring the voltage of an electrochemical cell or a plurality of superimposed electrochemical cells resulting from the stacking of separators and one or more membrane electrode assemblies.

For this purpose, the invention proposes a voltage-measuring device for carrying out voltage measurements on a laminate assembly formed of separators and at least one membrane electrode assembly stacked along a direction of lamination to form an electrochemical cell or a plurality of superimposed electrochemical cells, a separator being located at each end of the laminate assembly, the voltage-measuring device comprising two measuring plates, each measuring plate having a measuring face on which are distributed a plurality of spaced-apart electrical contacts electrically insulated from each other, the measuring plates being configured to be arranged on opposite sides of the laminate assembly, the measuring face of each measuring plate being applied against a respective one of the two separators located at the ends of the laminate assembly, such that the electrical contacts on that measuring face are in contact with said separator.

The measuring plates may be arranged on either side of the laminate assembly formed by superimposing separators and one or more membrane electrode assemblies, the measuring face of each of the two measuring plates being in contact with a face of a respective separator.

In particular, the measuring plates can be inserted into a stack of separators and membrane electrode assemblies of an electrochemical reactor, to measure the voltage of the laminate assembly formed by the electrochemical cell(s) of the electrochemical reactor located between the two measuring plates.

The electrical contacts distributed on the measuring face of each of the two measuring plates allow voltage measurements to be taken at different measurement points distributed over the separators, and thus to take into account a disparity in electrical voltage between the different measurement points defined by the different electrical contacts.

It is possible to map the voltage response of each electrochemical cell as a function of the position in an extension plane of the electrochemical cell parallel to the separators and the membrane electrode assembly of that electrochemical cell.

According to particular embodiments, the voltage-measuring device has one or more of the following features taken individually or in any combination that is technically possible:

- each measuring plate has a connector located on one edge of the plate, each electrical contact carried by the plate being connected to the connector;
- the connector of each measuring plate comprises a plurality of plugs, each plug being electrically connected to a respective one of the electrical contacts of the measuring plate;
- the electrical contacts are distributed over the measuring face of each measuring plate in such a way that each electrical contact of one measuring plate is opposite a respective electrical contact of the other measuring plate when the measuring faces of the measuring plates are arranged opposite each other.
- each measuring plate comprises a plate-like substrate made of an electrically insulating material and carrying the electrical contacts;
- the electrical contacts of each measuring plate are distributed in an area of the measuring face corresponding to the active surface of the electrochemical cell(s) of the laminate assembly;
- the electrical contacts of each measuring plate are distributed on the measuring face of the measuring plate in a matrix pattern, in rows and columns;
- it comprises a multi-channel voltage-measuring apparatus configured to determine voltage measurements, a voltage measurement being made for each measurement point defined by an electrical contact of one of the measuring plates and an associated electrical contact of the other measuring plate located substantially opposite each other;
- each measuring plate comprises windows arranged to be aligned with apertures of a separator against which the measuring plate is applied, provided for the flow of reactive fluids or a cooling fluid through the separator, each window of each measuring plate being aligned with a respective aperture of the separator.

The invention also relates to an assembly comprising a laminate assembly formed of separators and of at least one membrane electrode assembly stacked along a direction of lamination to form an electrochemical cell or a plurality of superimposed electrochemical cells, a separator being located at each end of the laminate assembly, and a voltage-measuring device as defined above, the measuring plates of which are arranged on either side of the laminate assembly, the measuring face of each measuring plate being applied against a respective one of the two separators located at the ends of the laminate assembly, so that the electrical contacts located on this measuring face are in contact with said separator.

In a particular embodiment, the assembly comprises an electrochemical reactor comprising a stack formed of stacked separators and membrane electrode assemblies defining superimposed electrochemical cells, the measuring plates being integrated into the stack on either side of a laminate assembly formed by separators and at least one membrane electrode assembly of the stack forming one or more electrochemical cells of the stack.

BRIEF DESCRIPTION OF THE DRAWINGS

The invention and its advantages will become apparent upon reading the following description, given only as a non-limiting example, referring to the attached drawings, in which:

FIG. 4 is a front view of a measuring plate of the voltage-measuring device.

Figure 1:
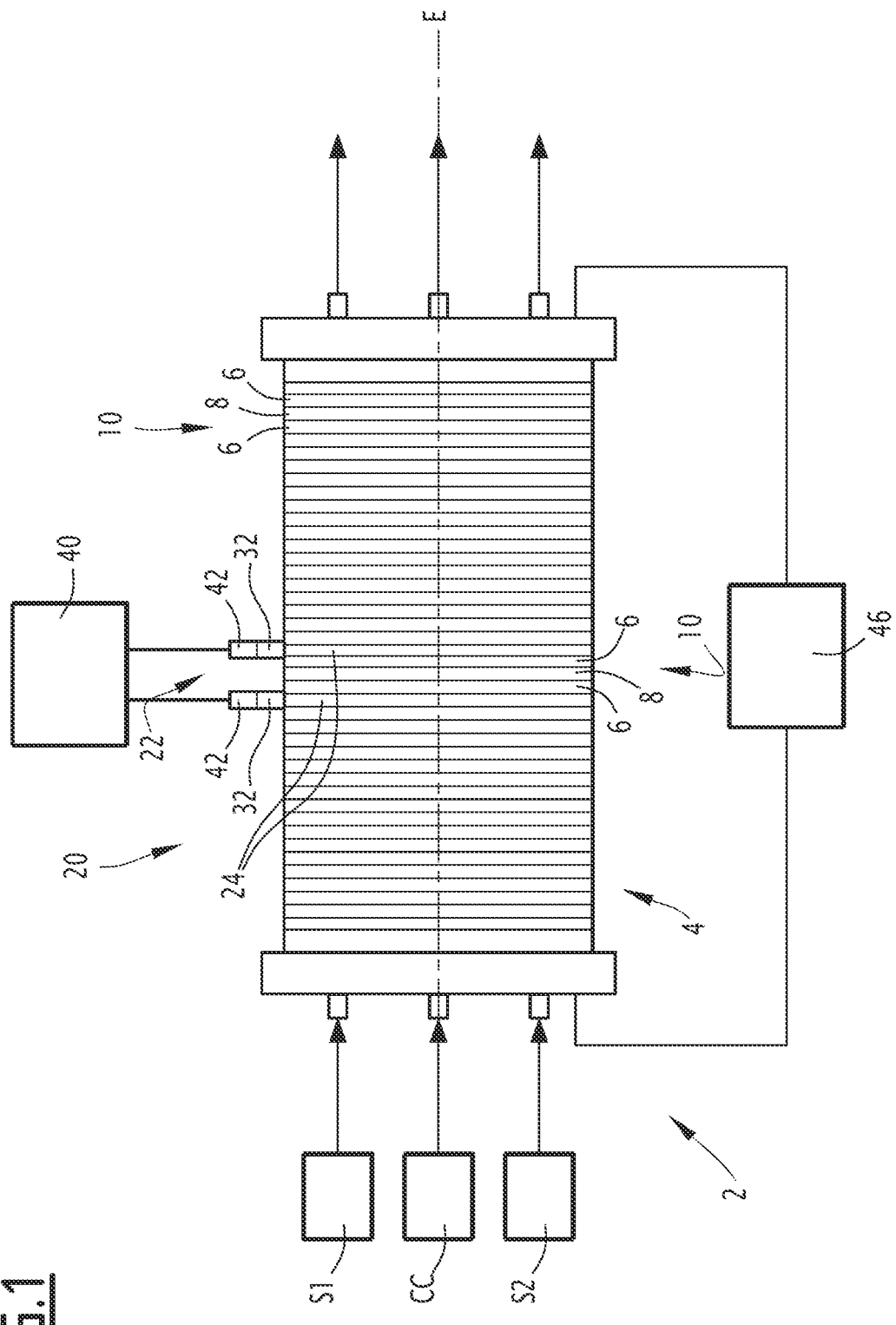
FIG. 1 is a side view of an electrochemical reactor consisting of a stack of separators and membrane electrode assemblies, the electrochemical reactor being equipped with a voltage-measuring device.
Figure 2:
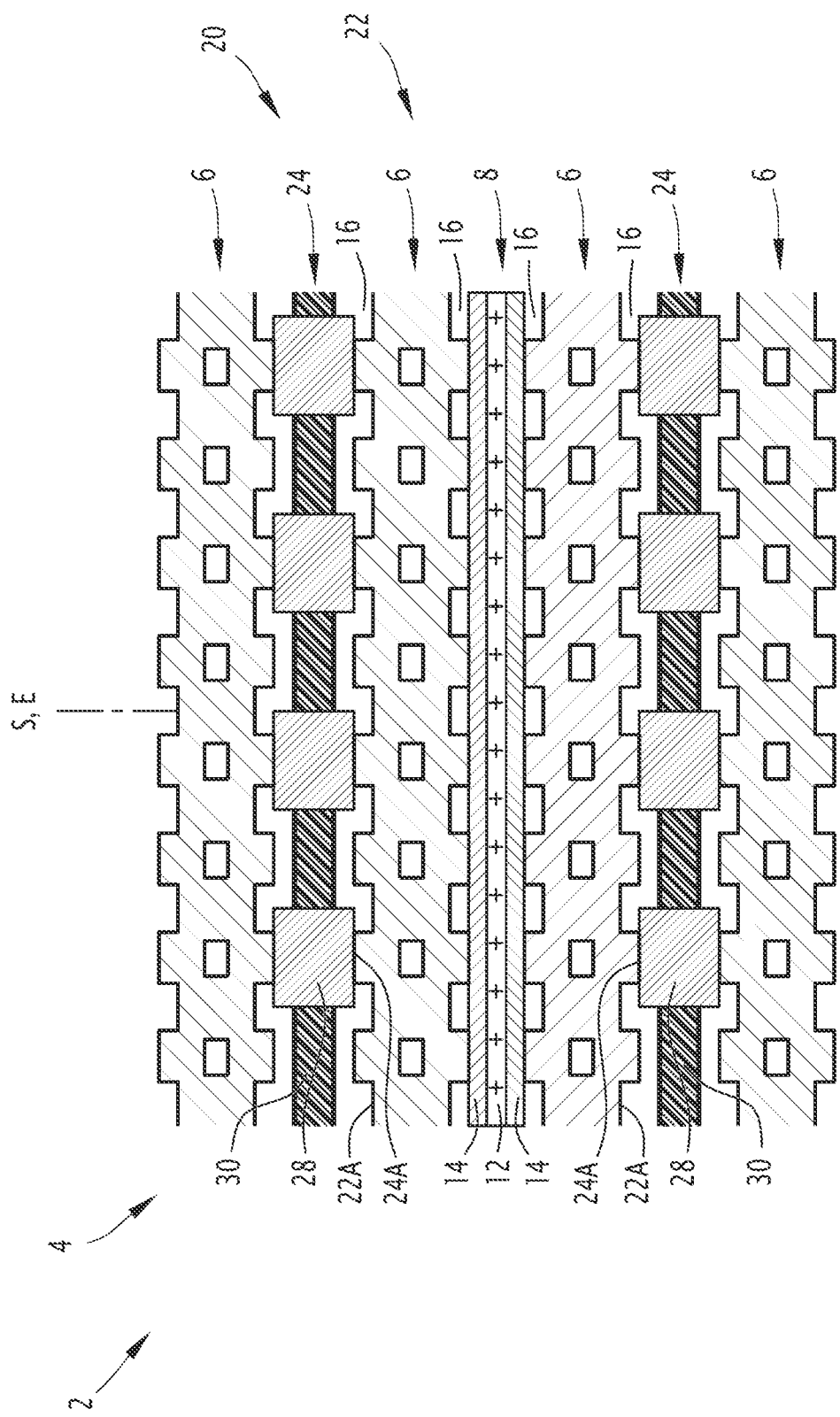
FIG. 2 is a cross-sectional view of an electrochemical cell, with measuring plates of the voltage-measuring device arranged on either side of the electrochemical cell.

The electrochemical reactor 2 shown in FIGS. 1 and 2 has a stack 4 of separators 6 and membrane electrode assemblies 8 defining a plurality of superimposed electrochemical cells 10.

DETAILED DESCRIPTION OF PREFERRED EMBODIMENTS

The separators 6 and the membrane electrode assemblies 8 are stacked along a stacking direction E. The electrochemical cells 10 are superimposed along the stacking direction E.

In practice, an electrochemical reactor 2 may comprise several tens or hundreds of superimposed electrochemical cells 10.

Figure 3:
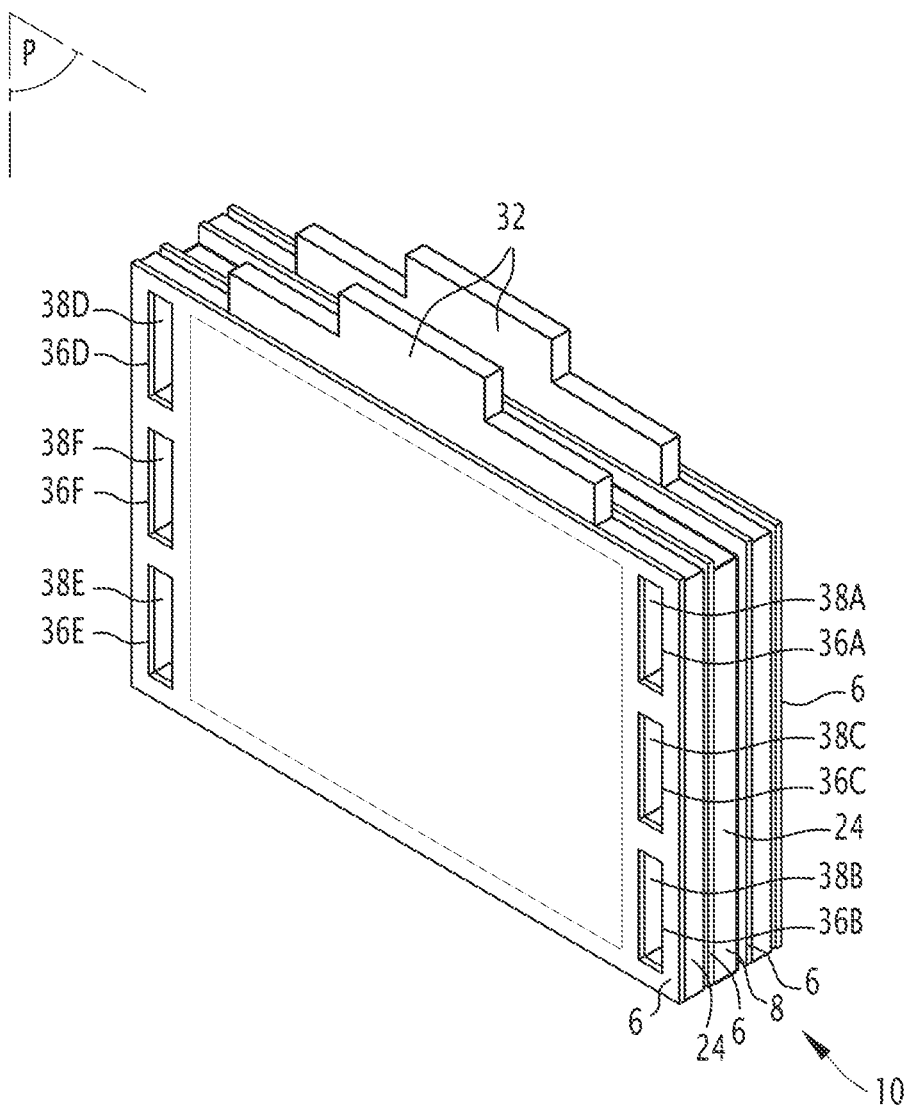
FIG. 3 is a perspective view of the electrochemical cell and measuring plates of the measuring device of FIG. 2.

As illustrated in FIGS. 2 and 3, each electrochemical cell 10 in the stack 4 is formed by a membrane electrode assembly 8 interposed between two separators 6.

The membrane electrode assembly 8 (MEA) is a laminate consisting of an ion exchange membrane 12 sandwiched between two electrodes 14 (FIG. 2). The ion exchange membrane 12 is for example a proton exchange membrane (PEM) or an anion exchange membrane (AEM).

Each separator 6 is electrically conductive.

Each separator 6 is for example made of a metallic material or preferably a material containing graphite powder and/or carbon powder, for example a composite material comprising graphite beam and/or carbon powder in a matrix made of a polymer binder and/or resin.

Each separator 6 is in the form of a plate. Each separator 6 has two opposing sides.

Each electrochemical cell 10 extends along a plane of extension P. The plane of extension P of each electrochemical cell 10 is perpendicular to the stacking direction E along which the separators 6 and the membrane electrode assembly 8 are stacked.

The separators 6 and the membrane electrode assembly 8 each extend along the plane of extension P. The plane of extension P is substantially parallel to the separators 6 and to the membrane electrode assembly 8 of the electrochemical cell 10.

In each electrochemical cell 10, each separator 6 is applied against a respective face of the membrane electrode assembly 8.

Each of the two separators 6 of the electrochemical cell 10 has its face applied against the membrane electrode assembly 8 which is configured to channel a fluid along the face of the membrane electrode assembly 8 against which the separator 6 is applied.

The side of the separator 6 that is applied against the membrane electrode assembly 8 has, for example, distribution channels 16 for the circulation of the fluid. The distribution channels 16 together define a fluid flow field or gas flow field.

When the face of the separator 6 is applied against the membrane electrode assembly 8, the flow field defines, together with the membrane electrode assembly 8, a fluid chamber.

In operation, in each electrochemical cell 10, the fluids flowing along the two opposite sides of the membrane electrode assembly 8 allow an electrochemical reaction to take place with an exchange of ions (or anions) between the fluids channelled through the two separators 6 located on either side of the membrane electrode assembly 8, the ions (or anions) passing through the membrane electrode assembly 8.

In each electrochemical cell 10, the electrochemical reaction takes place across the membrane electrode assembly 8 on an area known as the "active surface". The active surface extends along the plane of extension P. The active surface is the area of the membrane electrode assembly 8 that is located opposite the flow fields of the separators 6.

If the electrochemical reactor 2 is a fuel cell, one of the two separators 6 is configured to channel a fuel fluid along the face of the membrane electrode assembly 8 against which it is applied, the other separator 6 being configured to channel an oxidising fluid along the other face of the membrane electrode assembly 8 against which it is applied.

The stack 4 comprises, for example, bipolar separators 6 (also known as "bipolar plates"), each bipolar separator 6 being interposed between two membrane electrode assemblies 8, each of the two faces of the separator 6 being configured to channel a fluid along the face of the membrane electrode assembly 8 against which that face of the separator 6 is applied. Each bipolar separator 6 is common to two adjacent electrochemical cells 10.

The stack 4 comprises, for example, monopolar separators 6, each monopolar separator 6 having only one of its two faces applied against a face of a membrane electrode assembly 8, this face of the separator 6 being configured to channel a fluid along said face of the membrane electrode assembly 8. Each monopolar separator 6 belongs to a single electrochemical cell 10.

The stack 4 is for example formed of bipolar separators 6 stacked alternately with membrane electrode assemblies 8, with two monopolar separators 6 being arranged at the ends of the stack 4 to define the two electrochemical cells 10 located at the ends of the stack 4.

In each electrochemical cell 10, the separators 6 ensure fluid distribution and electrical conduction.

In the stack 4, the electrochemical cells 10 are electrically connected in series via the separators 6. Each electrochemical cell 10 is electrically connected to the next electrochemical cell 10.

In operation, each electrochemical cell 10 has an electrical voltage, which corresponds to the potential difference between the two separators 6 of that electrochemical cell 10, and an electrical current flows through it.

The voltage of the electrochemical cells 10 may vary from one electrochemical cell 10 to another. The electrical current through the electrochemical cells 10 is in principle the same since the electrochemical cells 10 are electrically connected in series.

As illustrated in FIGS. 1 to 3, a voltage-measuring device 20 is configured to measure the voltage across one electrochemical cell 10 or a plurality of superimposed electrochemical cells 10.

The voltage-measuring device 20 is configured to measure an electrical voltage across a laminate assembly 22 formed of separators 6 and at least one membrane electrode assembly 8 that are stacked along a lamination direction S and defining one or more electrochemical cells 10 superimposed along the lamination direction S, each electrochemical cell 10 being formed of a membrane electrode assembly 8 interposed between two separators 6.

The laminate assembly 22 comprises, along the lamination direction S, two opposing end faces 22A, each end face 22A is defined by a respective separator 6 of the laminate assembly 22.

The voltage-measuring device 20 comprises two measuring plates 24 configured to be disposed on either side of the laminate assembly 22, the laminate assembly 22 being interposed between the two measuring plates 24 along the lamination direction S.

Each measuring plate 24 has a measuring face 24A adapted to be brought into contact with a respective end face 22A of the laminate assembly 22, i.e. with a respective one of the two separators 6 at the ends of the laminate assembly 22.

The measuring plates 24 of the voltage-measuring device 20 are here integrated into the stack 4 of the electrochemical reactor 2 to measure the voltage of one of the electrochemical cells 10 of the stack 4.

The laminate assembly 22 consists of two separators 6 with a membrane electrode assembly 8 between them, the two separators 6 and the membrane electrode assembly 8 forming an electrochemical cell 10. The lamination direction S of the laminate assembly 22 coincides with the stacking direction E of the stack 4.

As shown in FIGS. 1 to 3, each of the two measuring plates 24 is inserted into the stack 4, preferably between two separators 6.

Each measuring plate 24 is for example configured to be inserted into the stack 4 between two bipolar separators 6, taking the place of a membrane electrode assembly 8.

Preferably, each measuring plate 24 is provided to ensure the serial electrical connection of two separators 6 between which the measuring plate 24 is interposed.

This allows the measuring plate 24 to be inserted into a stack 4 between two separators 6, for example in place of a membrane electrode assembly 8, without breaking the electrical series connection of the electrochemical cells 10.

Each measuring plate 24 carries on its measuring face 24A a plurality of electrical contacts 28 distributed over the measuring face 24A of the measuring plate 24 in a spaced-apart manner and electrically insulated from each other.

The electrical contacts 28 of each measuring plate 24 are arranged in such a way that the measuring plate 24 applied against the end face 22A of the laminate assembly 22 is in contact with this end face 22A via the electrical contacts 28.

Each measuring plate 24 comprises, for example, a plate-like substrate 30 made of an electrically insulating material, the substrate 30 carrying the electrical contacts 28.

Each electrical contact 28 is made of an electrically conductive material, for example a metallic material.

Preferably, the electrical contacts 28 of each measuring plate 24 are distributed in a measuring area corresponding in shape to that of the active surface of the membrane electrode assembly 8 or the membrane electrode assemblies 8 of the laminate assembly 2 interposed between the two measuring plates 24.

The measuring area of each measuring plate 24 covers in particular the flow field of each separator 6 of the laminate assembly 2.

The measuring area of each measuring plate 24 has, for example, a rectangular shape.

Preferably, the electrical contacts 28 of each measuring plate 24 are distributed over the measuring face 24A such that each electrical contact 28 of one measuring plate 24 is aligned with an associated respective electrical contact 28 of the other measuring plate 24 when the measuring faces 24A of the measuring plates 24 are arranged opposite each other.

When the measuring plates 24 are arranged on opposite sides of a laminate assembly 22, each electrical contact 28 of one measuring plate 24 is aligned with an associated respective electrical contact 28 of the other measuring plate 24 along the lamination direction S.

Each electrical contact 28 of one measuring plate 24 and the electrical contact 28 of the other measuring plate 24 together define a measurement point for measuring the voltage of the laminate assembly 22 taken between the two separators 6 contacting the ends of the laminate assembly 22.

In one embodiment, the electrical contacts 28 of each measuring plate 24 are distributed on the measuring face 24A of the measuring plate 24 in a matrix pattern. A matrix pattern is a distribution in rows and columns.

Advantageously, as illustrated in FIG. 2, one or more of the electrical contacts 28 of each measuring plate 24 pass through the substrate 30, so as to electrically connect two separators 6 between which the measuring plate 24 is interposed.

Thus, each measuring plate 24 may ensure the serial electrical connection of two separators 6 between which the measuring plate 24 is interposed.

In one particular example, as illustrated in FIG. 2, each electrical contact 28 of each measuring plate 24 passes through the substrate 30, so as to electrically connect two separators 6 between which the measuring plate 24 is interposed.

Each electrical contact 28 passing through the substrate 30 protrudes, for example, from the substrate 30 on the measuring face 24A of the measuring plate 24 and on the opposite side.

Advantageously, each measuring plate 24 has an external contour substantially identical to that of the separators 6. This allows the measuring plate 24 to be easily inserted into a stack 4 of an electrochemical reactor 2, for example between two separators 6 of the stack 4, with the measuring plate 24 aligned with the separators 6 without protruding.

Each measuring plate 24 is for example provided with an electrical connector 32 located on an edge of the measuring plate 24, each electrical contact 28 carried by the measuring plate 24 being connected to the electrical connector 32.

The electrical connector 32, for example, protrudes from the edge of the measuring plate 24. Thus, the electrical connector 32 can protrude from the stack 4 of the electrochemical reactor 2 when the measuring device 20 is integrated into this stack 4, which facilitates the connection of the measuring plate 24.

The electrical connector 32 comprises electrical plugs 34, each electrical plug 34 being connected to a respective electrical contact 28, for example via an electrical track (not shown, to keep the drawings clear).

As seen in FIG. 3, each separator 6 comprises apertures 36A, 36B, 36C, 36D, 36E, 36F configured to form, across a plurality of separators 6 stacked with one or more membrane electrode assemblies 8, conduits for the flow of reactive fluids required for the redox reaction, and optionally, for the flow of a cooling fluid.

In a stack of separators 6 and one or more membrane electrode assemblies 8 defining one or more electrochemical cells 10, such as stack 4 or laminate assembly 22, the apertures 36A, 36B, 36C, 36D, 36E, 36F of the separators 6 are aligned defining a plurality of conduits passing through the stack 4, each conduit permitting the flow of a reactive fluid or a cooling fluid. Each conduit is either an inlet conduit or an outlet conduit.

The flow fields of the separators 6, and any cooling conduits of the separators 6, are fluidly connected to the conduits defined by the apertures 36A, 36B, 36C, 36D, 36E, 36F, for the flow of reactive fluids into the flow fields, and the flow of any cooling fluid into the cooling conduits.

Each separator 6 comprises, for example, an aperture 36A for an inlet conduit for a first reactant fluid, an aperture 36B for forming an inlet conduit for a second reactant fluid, an aperture 36C for forming an inlet conduit for a cooling fluid, an aperture 36D for forming an outlet conduit for the first reactant fluid, an aperture 36E for forming an outlet conduit for the second reactant fluid, and an aperture 36F for forming an outlet conduit for the cooling fluid Preferably, each measuring plate 24 comprises windows 38A, 38B, 38C, 38D, 38E, 38F arranged so as to be aligned with the apertures 36A, 36B, 36C, 36D, 36E, 36F of a separator 6 against which the measuring plate 24 is applied, each measuring plate 24 window 38A, 38B, 38C, 38D, 38E, 38F being aligned with a respective aperture 36A, 36B, 36C, 36D, 36E, 36F of the separator 6.

Thus, each measuring plate 24 may be arranged on a laminate assembly 2 or inserted into the stack 4 while allowing the flow of each reactive fluid and optionally a cooling fluid through the laminate assembly 22 and, where applicable, the stack 4.

Returning to FIG. 1, the measuring plates 24 are integrated into the stack 4 by being located on either side of a laminate assembly 22 corresponding to an electrochemical cell 10, formed by a membrane electrode assembly 8 interposed between two separators 6.

Each measuring plate 24 is inserted into the stack 4 between two separators 6.

Only the connectors 32 of the measuring plates 24 protrude from the stack 4, more specifically from one side face 4A of the stack 4.

In the stack 4, the apertures 36A, 36B, 36C, 36D, 36E, 36F of the separators 6 are aligned to define a plurality of conduits through the stack 4, each conduit allowing the flow of a reactive fluid or a cooling fluid. Each conduit is either an inlet conduit or an outlet conduit.

The stack 4 is fluidly connected to at least one reactive fluid source, in this case two reactive fluid sources S1, S2, and optionally to a cooling circuit CC.

Each reactive fluid source S1, S2 is for example connected to an inlet conduit defined by apertures 36A, 36B. If applicable, the DC cooling circuit is for example connected to an inlet conduit defined by the apertures 36C. Each of the inlet conduits opens at one end of the stack 4. The outlet conduits formed by apertures 36D, 36E, 36F each open at one end of the stack 4.

The measuring plates 24 are integrated into the stack 4 with each of their windows 38A, 38B, 38C, 38D, 38E, 38F aligned along the stacking direction E with the corresponding aperture 36A, 36B, 36C, 36D, 36E, 36F of the separators 6. Thus, the measuring plates 24 allow the flow of fluids through the stack 4.

Each measuring plate 24 provides an electrical connection in series between the two separators 6 between which it is interposed, to ensure the serial electrical connection of all the electrochemical cells 10 in the stack 4.

The voltage measurement device 20 comprises a multi-channel voltage-measuring apparatus 40 configured, when connected to the measuring plates 24, to measure the voltage across the laminate assembly 22 at each measurement point defined by two associated electrical contacts 28 of the measuring plates 24.

Advantageously, the multi-channel voltage-measuring apparatus 40 is configured to map the voltage across the laminate assembly 22 for each measurement point defined by the associated electrical contacts 28 of the measuring plates 24.

As illustrated in FIG. 1, the multi-channel voltage-measuring apparatus 40 is connected to the measuring plates 24 via apparatus connectors 42 complementary to the plate connectors 32, each apparatus connector 42 being connected to a respective plate connector 32.

The multi-channel voltage measuring apparatus 40 is, for example, configured to determine a polarisation map of the laminate assembly 22 and derive a polarisation map of an electrochemical cell 10 of the laminate assembly 22.

The polarisation map is the voltage response of the laminate assembly 22 or an electrochemical cell 10 of the laminate assembly 22 as a function of the current flowing through the laminate assembly 22 or electrochemical cell 10, for the different measurement points defined by the electrical contacts 28 of the measuring plates 24.

The polarisation map is determined by, for example, operating the electrochemical reactor 2 by imposing the current through the stack 4, and hence the laminate assembly 22 and each electrochemical cell 10, for example by means of a programmable load 46 connected across the stack 4, and measuring the voltage of the laminate assembly 22 at each measurement point defined by the electrical contacts 28 of the measuring plates 24.

When the laminate assembly 22 comprises a single electrochemical cell 10, the voltage at each measurement point may be taken as equal to the voltage at that measurement point of the electrochemical cell 10.

When the laminate assembly 22 comprises a plurality of superimposed electrochemical cells 8, the voltage at each measurement point for each electrochemical cell 10 may be taken as equal to the voltage of the laminate assembly 22 at that measurement point divided by the number of electrochemical cells 10 in the laminate assembly 22.

By means of the voltage-measuring device 20, it is possible to measure the voltage at different points of a laminate assembly 22 comprising one or more electrochemical cells 8, and to map the voltage of the laminate assembly 22 for the different measurement points.

The measurement points are distributed over an active area of the electrochemical cells 10. This makes it possible to detect voltage inhomogeneities. Such inhomogeneities may occur, for example, with separators 6 made of carbon composite material.

Measurements can be performed by integrating the measuring device 20 into a stack 4 of an electrochemical reactor, by performing the measurement on a laminate assembly 22 formed by one or more electrochemical cells 10 of the stack 4.

The voltage measurement can thus be carried out in situ, and thus take into account the performance parameters of the stack 4, such as the mechanical state of compression of the stack 4 and/or the connection of the separators 6 and the membrane electrode assemblies 8 for sealing the stack 4.

The mapping associated with these voltage measurements will also provide a picture of the heterogeneity of the electrical conduction properties of the separators 6 which can lead to heterogeneity in the operation of the stack 4.

The invention claimed is:

1. A voltage-measuring device configured to carry out voltage measurements on a laminate assembly formed of separators and of at least one membrane electrode assembly stacked along a direction of lamination to form an electrochemical cell or a plurality of superimposed electrochemical cells,
one of the separators being located at each end of the laminate assembly, the voltage-measuring device comprising two measuring plates, each of the two measuring plates having a measuring face on which are distributed a plurality of spaced-apart electrical contacts electrically insulated from each other, wherein
the plurality of spaced-apart electrical contacts of each of the two measuring plates are distributed over the measuring face such that each of the electrical contacts of one of the measuring plates is aligned with an associated respective said electrical contact of the other of the measuring plates when the measuring faces of the measuring plates are arranged opposite each other; and
the measuring plates being configured to be arranged on opposite sides of the laminate assembly, the measuring face of each said measuring plate being applied against a respective said separator of the two separators located at the ends of the laminate assembly, such that the electrical contacts on that measuring face (24A) are in contact with said separator.

2. The voltage-measuring device according to claim 1, wherein each of the measuring plates has a connector located on an edge of the plate, each said electrical contact carried by the plate being connected to the connector.

3. The voltage-measuring device according to claim 2, wherein the connector of each said measuring plate comprises a plurality of plugs, each of the plugs being electrically connected to a respective said electrical contact of the electrical contacts of the measuring plate.

4. The voltage-measuring device according to claim 1, wherein each of the measuring plates comprises a plate-like substrate made of an electrically insulating material, the plate-like substrate carrying the electrical contacts.

5. The voltage-measuring device according to claim 1, wherein the electrical contacts of each of the measuring plates are distributed in an area of the measuring face corresponding to an active surface of the electrochemical cell(s) of the laminate assembly.

6. The voltage-measuring device according to claim 1, wherein the electrical contacts of each of the measuring plates are distributed on the measuring face of the measuring plate in a matrix pattern, in rows and columns.

7. The voltage-measuring device according to claim 1, further comprising a multi-channel voltage-measuring apparatus configured to determine voltage measurements, a voltage measurement being made for each measurement point defined by a said electrical contact of one of the measuring plates and an associated said electrical contact of the other of the measuring plates located substantially opposite each other.

8. The voltage-measuring device according to claim 1, wherein each of the measuring plates comprises windows arranged so as to be aligned with apertures of a said separator against which the measuring plate is applied, provided for the flow of reactive fluids or a cooling fluid through the separator, each of the windows of each of the measuring plates being aligned with a respective aperture of the separator.

9. An assembly comprising:
    a laminate assembly formed of separators and of at least one membrane electrode assembly stacked along a direction of lamination to form an electrochemical cell or a plurality of superimposed electrochemical cells,
    a separator being located at each end of the laminate assembly, and
    a voltage-measuring device configured to carry out voltage measurements on the laminate assembly, the voltage-measuring device comprising two measuring plates, each of the two measuring plates having a measuring face on which are distributed a plurality of spaced-apart electrical contacts electrically insulated from each other,
    the two measuring plates of the voltage-measuring device being arranged on either side of the laminate assembly, the measuring face of each of the measuring plates being applied against a respective one of the two separators located at the ends of the laminate assembly, so that the electrical contacts located on this measuring face are in contact with said separator.

10. The assembly according to claim 9, further comprising an electrochemical reactor comprising a stack formed of stacked said separators and said membrane electrode assemblies defining the superimposed electrochemical cells, the measuring plates being integrated into the stack on either side of the laminate assembly formed by the separators and at least one said membrane electrode assembly of the stack forming one or more of the electrochemical cells of the stack.

11. A voltage-measuring device configured to perform voltage measurements on a laminate assembly, the laminate assembly comprising, arranged in a stack along a direction of lamination:
    at least one electromechanical cell, each comprising:
        a membrane electrode assembly, and
        two separators in contact with respective faces of the membrane electrode assembly;
    wherein the laminate assembly is arranged so that one said separator is arranged at each end of the stack forming the laminate assembly;
    the voltage-measuring device comprising:
        two measuring plates, each comprising:
            a plate-like substrate comprising an electrically insulating material, one face of the plate-like substrate being a measuring face; and
            a plurality of spaced-apart electrical contacts arranged on the measuring face, the electrical contacts being separated from one another by the electrically insulating material,
        wherein the plurality of spaced-apart electrical contacts of each of the two measuring plates are distributed over the measuring face such that each of the electrical contacts of one of the measuring plates is aligned with an associated respective said electrical contact of the other of the measuring plates when the measuring faces of the measuring plates are arranged opposite each other;
        wherein the two measuring plates are disposed on respective ends of the stack forming the laminate assembly so that each of the measuring plates is adjacent to one of the separators arranged at the ends of the stack forming the laminate assembly, with the electrical contacts being in contact with a corresponding said separator.

12. The voltage-measuring device according to claim 11, wherein each of the measuring plates has a connector located on an edge of the measuring plate, each said electrical contact carried by the plate being connected to the connector.

13. The voltage-measuring device according to claim 12, wherein the connector of each said measuring plate comprises a plurality of plugs, each of the plugs being electrically connected to a respective said electrical contact of the measuring plate.

14. The voltage-measuring device according to claim 11, wherein the electrical contacts are distributed over the measuring face of each of the measuring plates in such a way that each said electrical contact of one of the measuring plates is opposite a respective said electrical contact of the other measuring plate when the measuring faces of the measuring plates are arranged opposite each other.

15. The voltage-measuring device according to claim 11, wherein the electrical contacts of each of the measuring plates are distributed in an area of the measuring face corresponding to an active surface of the at least one electrochemical cell of the laminate assembly.

16. The voltage-measuring device according to claim 11, wherein the electrical contacts of each of the measuring plates are distributed on the measuring face of the measuring plate in a matrix pattern, in rows and columns.

17. The voltage-measuring device according to claim 11, further comprising a multi-channel voltage-measuring apparatus configured to determine voltage measurements, a voltage measurement being made for each measurement point defined by a said electrical contact of one of the measuring plates and an associated said electrical contact of the other of the measuring plates located substantially opposite each other.

18. The voltage-measuring device according to claim 11, wherein each of the measuring plates comprises windows arranged so as to be aligned with apertures of a said separator adjacent the measuring plate, provided for a flow of reactive fluids or a cooling fluid through the separator, each of the windows of each of the measuring plates being aligned with a respective aperture of the separator.

* * * * *